United States Patent

Suzuki et al.

[11] Patent Number: 6,095,806
[45] Date of Patent: Aug. 1, 2000

[54] SEMICONDUCTOR WAFER BOAT AND VERTICAL HEAT TREATING SYSTEM

[75] Inventors: Shizuo Suzuki; Hisashi Kitamiya, both of Kitakami; Hirofumi Kitayama, Aiko-gun, all of Japan

[73] Assignees: Tokyo Electron Limited, Tokyo; Kabushiki Kaisha Toshiba, Kawasaki, both of Japan

[21] Appl. No.: 09/337,402

[22] Filed: Jun. 22, 1999

[30] Foreign Application Priority Data

Jun. 24, 1998  [JP]  Japan .................................. 10-193702

[51] Int. Cl.[7] ...................................................... F27D 5/00
[52] U.S. Cl. .......................... 432/241; 432/241; 432/253; 432/258; 414/938; 211/41.18
[58] Field of Search ..................................... 432/239, 241, 432/253, 258; 414/936, 938, 940; 219/209, 391; 392/416, 418; 438/716; 118/724, 725, 728, 729; 211/41.18

[56] References Cited

U.S. PATENT DOCUMENTS

| | | |
|---|---|---|
| 4,802,842 | 2/1989 | Hirayama . |
| 4,872,554 | 10/1989 | Quernemoen . |
| 5,054,418 | 10/1991 | Thompson et al. . |
| 5,055,036 | 10/1991 | Asano et al. . |
| 5,310,339 | 5/1994 | Ushikawa . |
| 5,316,472 | 5/1994 | Niino et al. . |
| 5,445,486 | 8/1995 | Kitayama et al. . |
| 5,458,688 | 10/1995 | Watanabe . |
| 5,586,880 | 12/1996 | Ohsawa . |
| 5,915,957 | 6/1999 | Tanigawa ................................ 432/241 |

*Primary Examiner*—Denise L. Ferensic
*Assistant Examiner*—Gregory A. Wilson
*Attorney, Agent, or Firm*—Oblon, Spivak, McClelland, Maier & Neustadt, P.C.

[57] ABSTRACT

A boat for semiconductor wafers includes first, second and third support rods arranged between and connected to top and bottom plates. The first, second and third support rods include a plurality of first racks, a plurality of second racks, and a plurality of third racks, respectively, such that the racks of each rods are vertically arrayed with gaps therebetween. The first, second and third racks serving to define a plurality of horizontal wafer supporting levels. Each wafer supporting level is defined by only combination of the first, second and third racks of the corresponding height. In each wafer supporting level, the first and second racks are arranged substantially in symmetry with respect to an axis passing through the center of a wafer transfer port, and the third rack is arranged deviant from the axis by a certain distance corresponding to 5% to 48% of the diameter of the wafer.

20 Claims, 9 Drawing Sheets

SEMICONDUCTOR WAFER BOAT AND VERTICAL HEAT TREATING SYSTEM

BACKGROUND OF THE INVENTION

The present invention relates to a boat for holding semiconductor wafers to be vertically stacked with gaps therebetween and to a heat treating system using the particular boat.

In the manufacture of ICs (Integrated Circuits), steps for subjecting a surface of a semiconductor wafer to a heat treatment for performing deposition or oxidation/diffusion, and steps for etching a film formed on the wafer are repeated several times. In applying a heat treatment to the wafer, a vertical heat treating system of a batch-processing type is generally used because a large number of wafers can be subjected to the heat treatment simultaneously. The vertical heat treating system includes a heating furnace having a process chamber made of quartz with a ceiling, and a heater arranged along the outer circumferential surface. A wafer boat holding a large number of wafers to be vertically stacked with gaps therebetween is arranged within the process chamber. Under this condition, a process gas is supplied into the process chamber to set up a process pressure and the wafers are maintained at a process temperature so as to carry out the heat treatment.

FIG. 14 is a perspective view showing a conventional wafer boat 1 together with a transfer device 14 and a boat elevator 12.

As shown in FIG. 14, the wafer boat 1 comprises four support rods 6A, 6B, 6C, and 6D. The upper and lower ends of these support rods are fixed to end plates 2 and 4, respectively. A large number of grooves 8A, 8B, 8C, and 8D are formed at a predetermined pitch on the circumferential surfaces of these support rods 6A, 6B, 6C, and 6D, respectively. A horizontal wafer supporting level is defined by these four grooves 8A to 8D having the corresponding height. To be more specific, the lower surface at the peripheral portion of a wafer W is allowed to abut against the four grooves 8A to 8D for the wafer W to be held on the wafer boat.

The wafer boat 1 is disposed on a heat insulating cylinder 10 made of quartz, which is moved up and down by boat elevator 12 having, for example, a ball screw arranged therein. The transfer device 14 movable both vertically and horizontally for the transfer of wafers W into and out of the wafer boat 1 is arranged adjacent to the boat elevator 12. The transfer device 14 includes a transfer arm 16 for holding a wafer W horizontal, the transfer arm 16 being capable of a reciprocating movement.

Where a wafer W is transferred into the wafer boat 1, the transfer arm 16 holding the wafer W is moved toward the wafer boat 1, as shown in FIG. 14. Then, the peripheral portion of the wafer W is positioned in the grooves 8A to 8D as shown in FIG. 15. Under this state, the transfer arm 16 is slightly moved downward. As a result, the wafer W is held in the grooves 8A to 8D so as to transfer the wafer W from the transfer arm 16 onto the wafer boat 1. Then, the transfer arm 16 is moved backward so as to be withdrawn from the wafer boat 1. The operation described above is repeated many times to cause a large number of wafers W to be held at a predetermined pitch by the wafer boat 1.

The wafer boat 1 holding these many wafers W is moved upward by the boat elevator 12 so as to be loaded into the process chamber (not shown) from the lower end portion of the process chamber. These many wafers held at a predetermined pitch by the wafer boat 1 are subjected to a heat treatment within the process chamber. Where the wafers W are unloaded from the process chamber, the wafer boat 1 is moved downward by the operation opposite to that described previously.

However, it has been found that, in the case of using the conventional wafer boat 1, a large number of particles are generated when the wafer boat 1 is loaded into or unloaded from the process chamber and when the wafers W are transferred into or out of the wafer boat 1, leading to a decrease in the product yield.

BRIEF SUMMARY OF THE INVENTION

An object of the present invention is to provide a boat for semiconductor wafers that permits suppressing the particle generation and to provide a heat treating system using the particular boat.

According to a first aspect of the present invention, there is provided a boat for holding a plurality of semiconductor wafers to be vertically stacked with gaps therebetween, the wafers having circular contours of substantially the same size, comprising:

upper and lower frames arranged at upper and lower end portions, respectively, of the boat; and first, second and third support rods arranged between and connected to the upper and lower frames, the first, second and third support rods being arranged such that a port through which the wafers are transferred into and taken out of the boat is defined between the first and second support rods, wherein the first, second and third support rods are provided with a plurality of first racks vertically arrayed with gaps therebetween, a plurality of second racks vertically arrayed with gaps therebetween, and a plurality of third racks vertically arrayed with gaps therebetween, respectively, such that a plurality of horizontal wafer supporting levels are defined between the upper and lower frames by the racks, each wafer supporting level being defined by combination of first, second and third racks having corresponding height, and wherein the first and second racks are arranged substantially in symmetry with respect to an axis which is parallel to a transfer direction, in which the wafers are transferred into and out of the boat through the port, and passes through a center of the port, and the third rack is shifted from the axis by a certain distance.

According to a second aspect of the present invention, there is provided a vertical heat treating system, comprising:

(a) a heating furnace for applying a heat treatment simultaneously to a plurality of semiconductor wafers having circular contours of substantially the same size;

(b) a boat according to the first aspect for holding the wafers to be vertically stacked with gaps therebetween within the heating furnace;

(c) a boat transfer device for transferring the boat holding the wafers between a position within the heating furnace and a transfer position outside the heating furnace; and (d) a transfer device including a transfer arm capable of a reciprocating movement for transfer of each wafer into and out of the boat at the transfer position.

Additional objects and advantages of the invention will be set forth in the description which follows, and in part will be obvious from the description., or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 14:
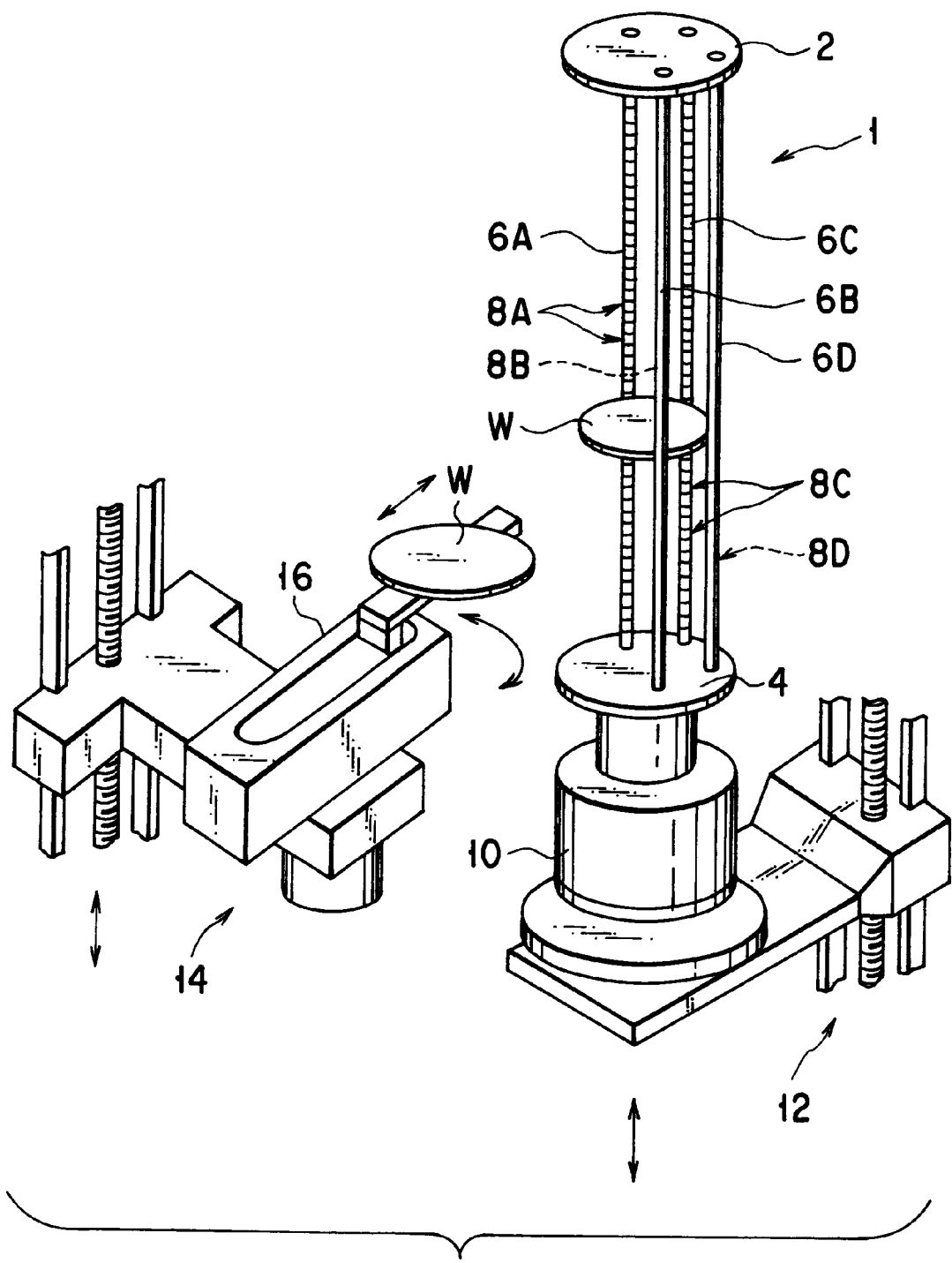
FIG. 14 is a perspective view showing a conventional wafer boat together with a transfer device and a boat elevator.
Figure 15:
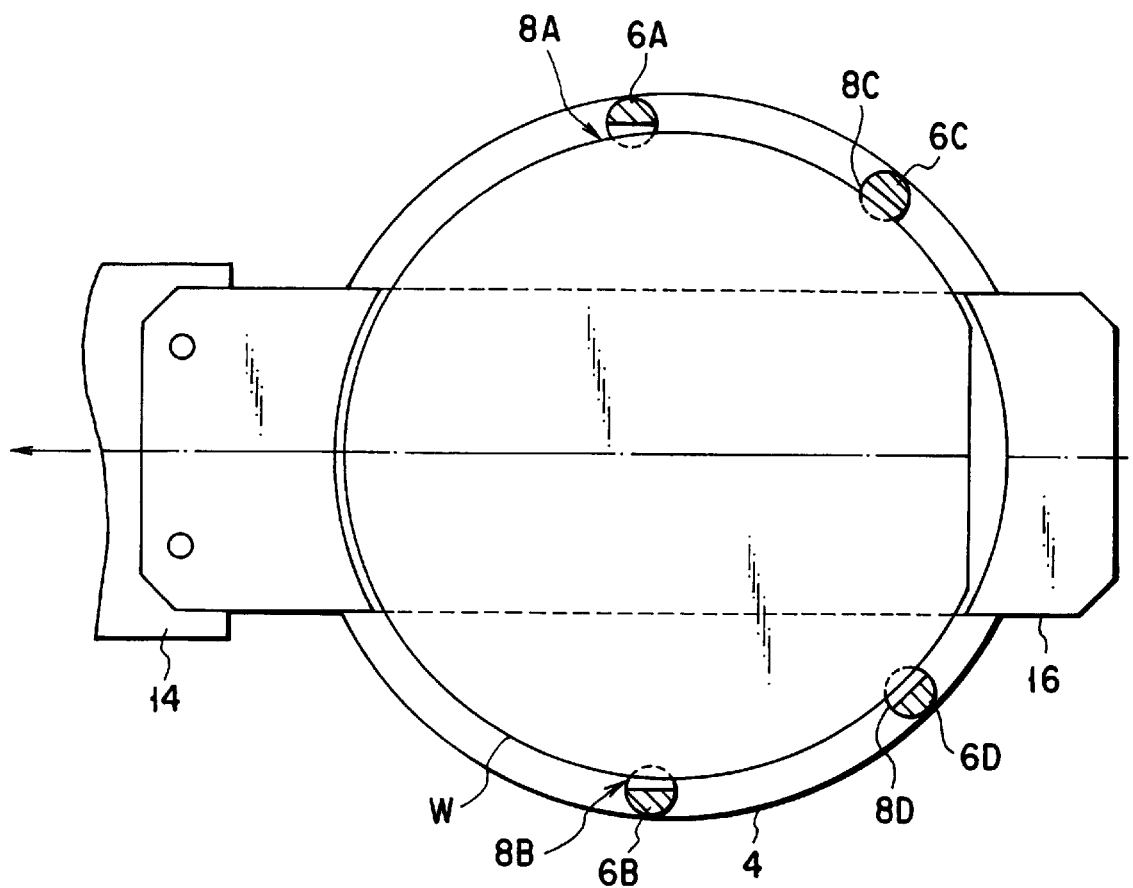
FIG. 15 is a cross sectional plan view showing the positional relationship among the wafer boat shown in FIG. 14, a wafer, and a transfer arm.

The present inventors have conducted an extensive research on the cause of the particle generation in the conventional wafer boat 1 shown in FIGS. 14 and 15 so as to arrive at the finding given below.

Specifically, it is unavoidable for the four grooves 8A to 8D forming each wafer supporting level to be microscopically different from each other in height. The microscopic difference in height is unavoidably generated during the boat manufacturing process or by thermal deformation. Therefore, the wafer W is supported by only three grooves (three-point support) when viewed microscopically, with the result that a microscopically small clearance is generated between the remaining one groove and the back surface of the wafer. In other words, one of the grooves is out of contact with the wafer.

As described previously, the boat elevator 12 is driven when the wafer boat 1 is loaded into or unloaded from the process chamber. During the driving, vibration is generated from the ball screw, etc. included in the boat elevator 12 and is transmitted via the wafer boat 1 to the wafer W. As a result, a slight mechanical collision is generated at a low frequency like chattering between the wafer supported at three points and the remaining groove that is out of contact with the wafer. By the impact of the mechanical collision, the surface of the wafer and the surface of the groove are rubbed each other. As a result, a film attached to the wafer boat 1 or the wafer W is peeled off to bring about the particle generation.

In the vertical heat treating system, the wafer W is transferred into the wafer boat 1 as follows. Specifically, the wafer W is held substantially horizontal on the transfer arm 16 of the transfer device 14, and the height of the wafer W is aligned with the wafer supporting level formed by the four grooves 8A to 8D of the boat 1. Then, the transfer arm 16 is moved forward in a horizontal direction so as to insert the wafer W into the grooves 8A to 8D of the wafer boat 1 in a non-contact state. Further, the transfer arm 16 is moved downward and, then, backward to leave the wafer W onto the boat 1.

In this case, the transfer device 14 and the transfer arm 16 of the wafer are automatically caused to perform the wafer transferring operations based on the data on the stopping positions, etc. stored in advance in the memory section of a computer (not shown). The input operation of these data, which is called a teaching operation, is carried out by storing in the computer the stopping position of the transfer device 14 for each wafer supporting level of the wafer boat 1 based on the visual confirmation by an operator. However, since the teaching operation is based on the visual confirmation by the operator and since the wafer boat 1 made of quartz itself is thermally deformed gradually by the heat treatment at high temperatures that is repeated several times, a slight collision takes place in some cases between the wafer boat 1 and the edge of the wafer W during transfer of the wafer W. The particle generation also takes place by the mechanical collision at the contact portion.

It has been confirmed by the experiments conducted by the present inventors that the particles on the wafer surface are generated in large amounts around the support rods 6C and 6D positioned on the rear side of the wafer boat 1 in any of the cases where the wafer boat 1 is loaded into or unloaded from the process chamber and where the wafer W is transferred into or out of the wafer boat 1.

Some embodiments of the present invention achieved on the basis of the finding given above will now be described with reference to the accompanying drawings. In the following description, the constituent elements having substantially the same function and arrangement are denoted by the same reference numerals, and a repetitive description will be made only when necessary.

Figure 1:
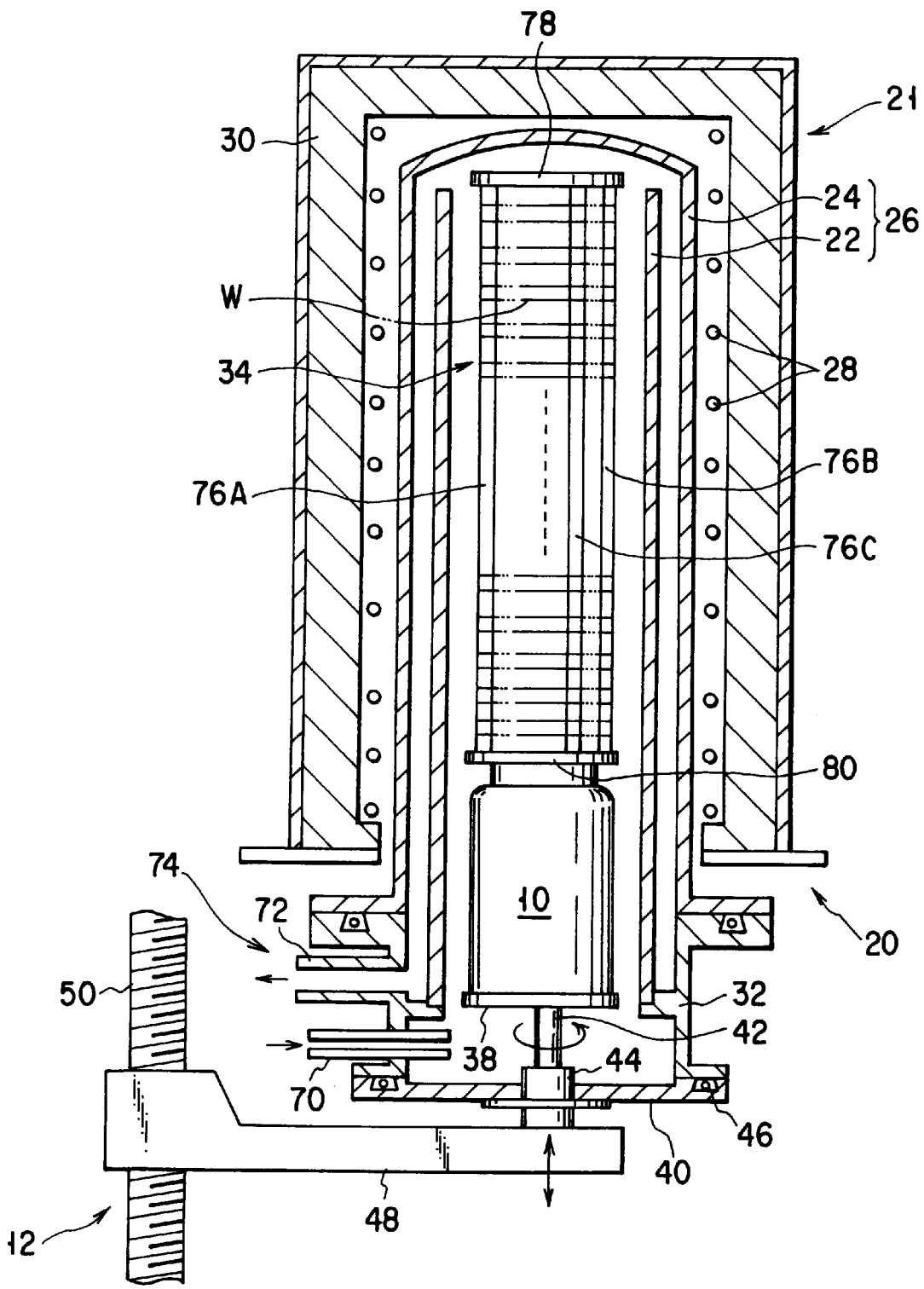
FIG. 1 is a cross sectional view showing the state that a boat for semiconductor wafers according to one embodiment of the present invention is housed in a heating furnace included in a vertical heat treating system.

FIG. 1 is a cross sectional view showing the state that a boat 34 for semiconductor wafers according to one embodiment of the present invention is housed in a heating furnace 21 included in a vertical heat treating system 20. On the other hand, FIG. 2 is a perspective view showing the state that the wafer boat 34 shown in FIG. 1 is arranged at a transfer position outside the heating furnace 21 of the vertical heat treating system 20.

Figure 2:
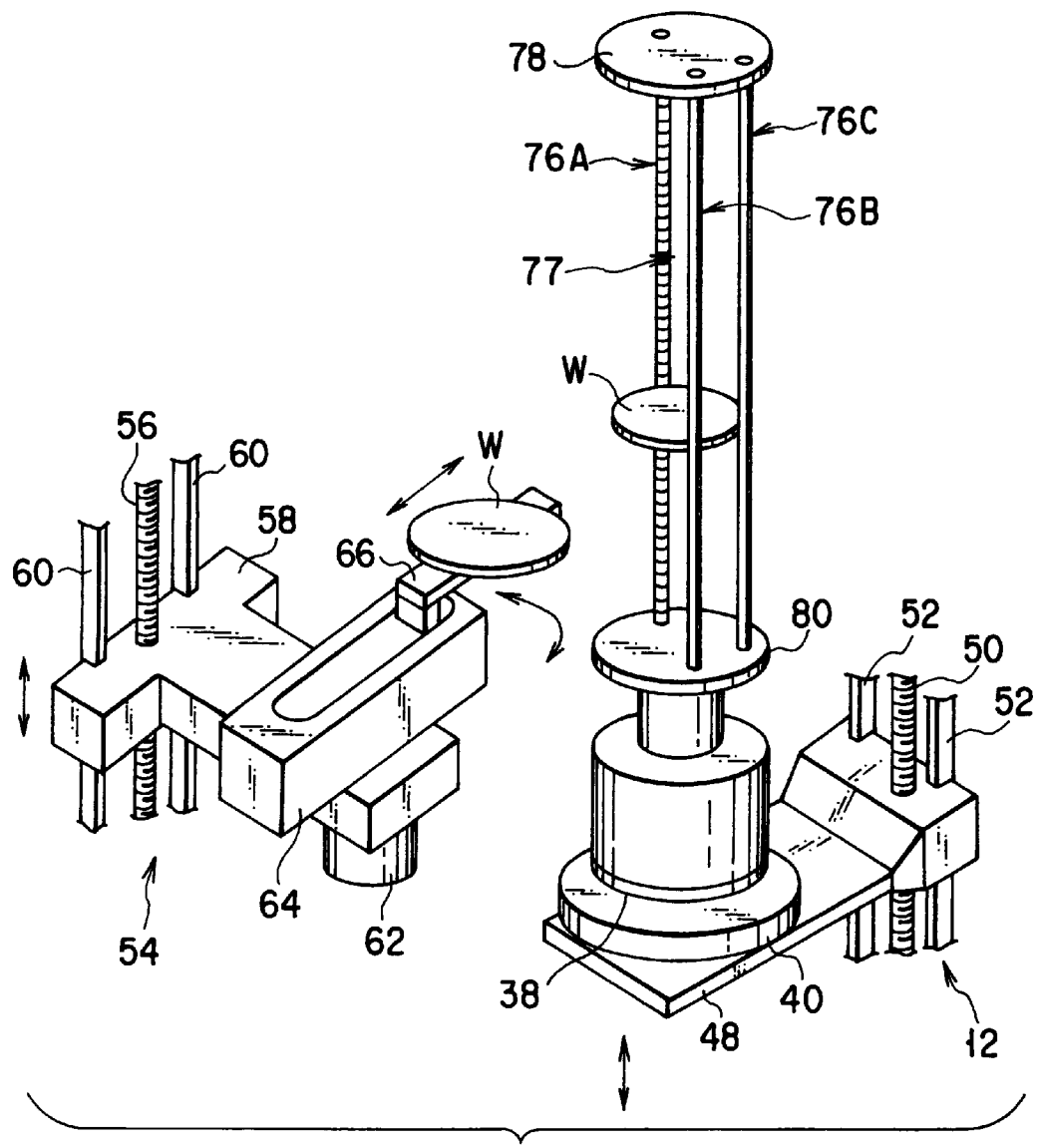
FIG. 2 is a perspective view showing the state that the wafer boat shown in FIG. 1 is arranged at a transfer position outside the heating furnace included in the vertical heat treating system.

As shown in FIGS. 1 and 2, the heating furnace 21 of the vertical heat treating system 20 includes a process chamber 26 of a double wall structure consisting of an inner cylinder 22 made of quartz and an outer cylinder 24 made of quarts with a ceiling, and arranged outside and concentric with the inner cylinder 22. Heating means 28 are arranged a predetermined distance apart from each other to surround the outer surface of the process chamber 26, and the outer circumferential surface of the heating means 28 is covered with a heat insulating member 30. The heating means 28 is arranged over the entire inner surface of the heat insulating member 30.

The lower end of the process chamber 26 is supported by a cylindrical manifold 32 made of, for example, a stainless steel. The wafer boat 34 made of, for example, quartz and holding a large number of semiconductor wafers W is moved in a vertical direction through the lower port of the manifold 32 so as to be loaded into and unloaded from the process chamber 26.

The wafer boat 34 is disposed on a turn table 38 with the heat insulating cylinder 10 made of quartz interposed therebetween. The turn table 38 is supported by a rotary shaft 42 extending through a lid 40 serving to open and close the lower port of the manifold 32. Arranged at the extending portion of the rotary shaft 42 through the lid 40 is, for example, a magnetic fluid seal 44 to have the rotary shaft 42 sealed hermetic and supported rotatable. Also arranged at the periphery of the lid 40 and at the lower end portion of the manifold 32 is a seal member 46 consisting of, for example, an O-ring.

The rotary shaft 42 is mounted to the tip of an arm 48 supported by the boat elevator 12 to permit the wafer boat 34, the lid 40, etc. to be moved together in a vertical direction. A ball screw 50 extends through the proximal end portion of the arm 48 to cause the arm 48 to be driven in a vertical direction. As shown in FIG. 2, the arm 48 is driven in a vertical direction along two guide rails 52 in accordance with rotation of the ball screw 50.

A transfer device 54 for transferring the wafer into and out of the wafer boat 34 is arranged in the vicinity of the transfer position at which the boat elevator 12 is stopped at the lower side. The transfer device 54 includes a transfer base 58. A ball screw 56 extends through the proximal end portion of the transfer base 58 to cause the transfer base 58 to be moved in a vertical direction. The transfer base 58 is guided in a vertical direction by two guide rails 60. A swingable arm 64 that can be swung by a swinging motor 62 is mounted at the tip of the transfer base 58. Further, a transfer arm 66 shaped like, for example, a plate, which can be moved back and forth (reciprocating sliding movement) by a driving motor (not shown), is mounted to the swingable arm 64.

Figure 3:
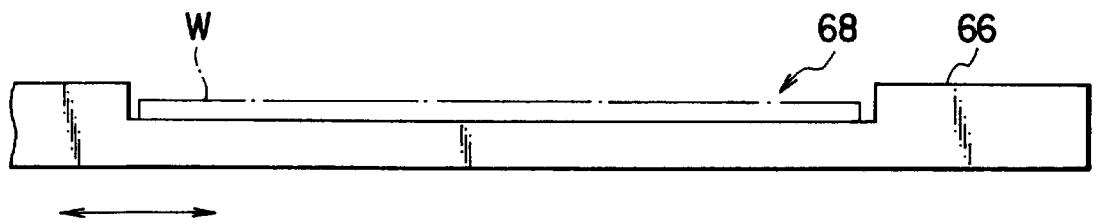
FIG. 3 is a side view showing a transfer arm included in the vertical heat treating system shown in FIG. 1.

As shown in FIG. 3, a shallow recess 68 for supporting the lower surface of the wafer W around its center in the radial direction is formed in the center of the transfer arm 66. The transfer arm 66 supporting the wafer W in the recess 68 is moved in both the horizontal direction and the vertical direction to carry out the wafer transfer between the wafer boat 34 and the transfer arm 66.

Figure 8:
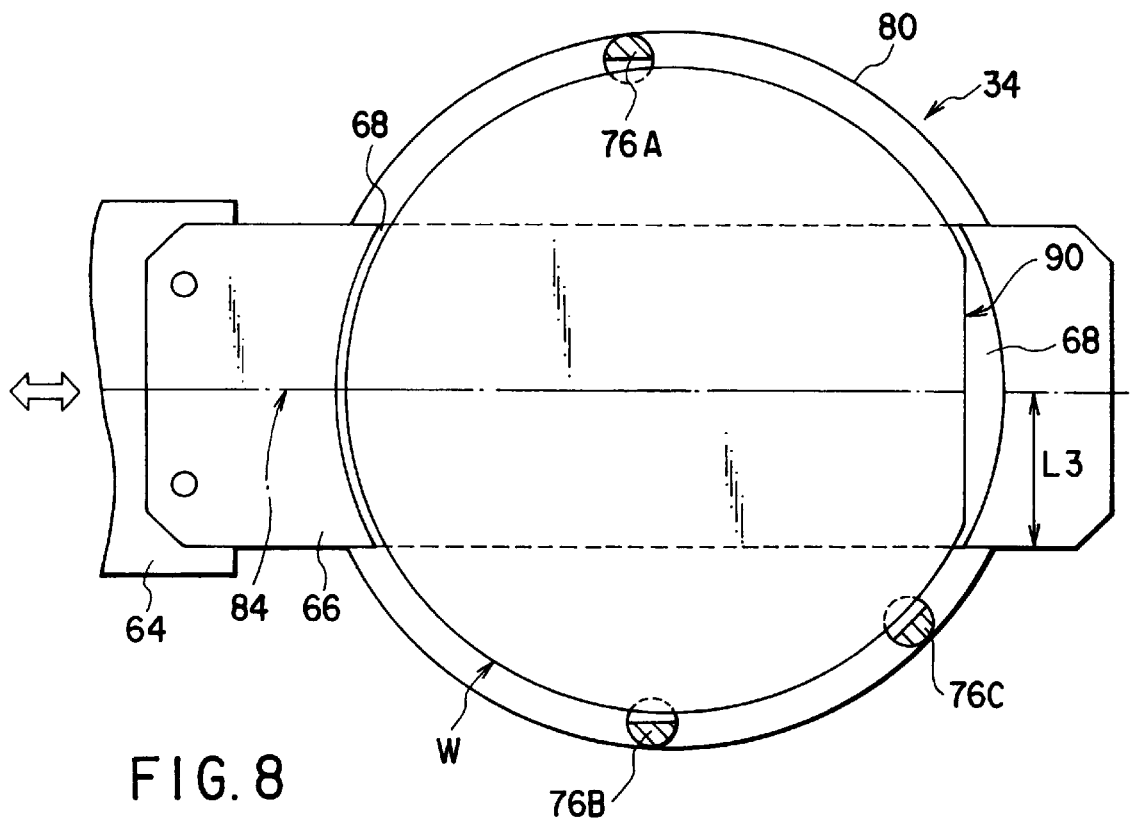
FIG. 8 is a cross sectional plan view showing the positional relationship among the wafer boat shown in FIG. 1, a wafer and the transfer arm.

As shown in FIGS. 3 and 8, the recess 68 is formed slightly larger than the diameter of the wafer W. The recess 68 functions as a guide means for guiding the wafer W to a predetermined position of the transfer arm 66 during transfer of the wafer W. To be more specific, the recess 68 serves to prevent the wafer W from being deviated or dropped by the movement of the transfer arm 66 when the wafer W is transferred between the wafer boat 34 and a wafer cassette (not shown). Further, the recess 68 automatically moves the wafer W to a predetermined position of the transfer arm 66 even if the wafers are deviated from the groove of the wafer boat 34 by the mechanical vibration of the boat elevator when the wafer W is removed from the wafer boat 34.

Because of the particular functions described above, the transfer arm 66 includes a portion projecting in size from the wafer W at the tip in the longitudinal direction. Also, the width of the transfer arm 66 is set larger than the width of the orientation flat 90 of the wafer W, so that no problem is generated wherever the orientation flat 90 of the wafer W is positioned on the transfer arm 66. In other words, the tip of the transfer arm 66 projects forward of the orientation flat 90 of the wafer W.

As shown in FIG. 1, a supply nozzle 70 for introducing a process gas into the inner cylinder 22 is arranged through the side wall of the manifold 32. Also, an exhaust nozzle 72 is arranged in the manifold 32 for exhausting the atmosphere within the process chamber through the clearance between the inner cylinder 22 and the outer cylinder 24. A vacuum pump (not shown) included in an exhaust system 74 is connected to the exhaust nozzle 72.

The wafer boat 34 will now be described.

Figure 4:
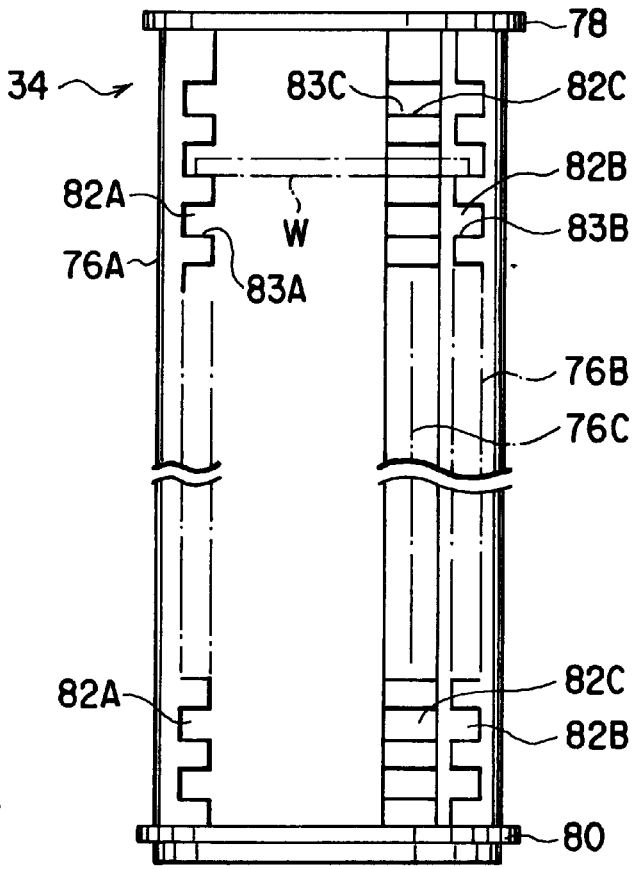
FIG. 4 is a front view of the wafer boat shown in FIG. 1.

Specifically, the entire wafer boat 34 is made of, for example, quartz exhibiting a high heat resistance and having a high durability. As shown in FIGS. 2 and 4, the wafer boat 34 comprises three support rods 76A, 76B, and 76C, a top plate 78, and a bottom plate 80. These top plate 78 and bottom plate 80 are fixed to the upper ends and lower ends, respectively, of the support rods 76A, 76B, and 76C. In addition to quartz, any one of high purity ceramic materials such as $Al_2O_3$, SiC, polycrystalline silicon, and carbon can be used for forming the wafer boat 34.

Recesses that are, for example, semi-circular are formed at a predetermined pitch on the inner sides of the support rods 76A to 76C to form a number of grooves 82A to 82C. For example, 100 to 160 grooves 82A, 82B, or 82C are formed in each of the support rods 76A to 76C. The flat lower surfaces of these grooves 82A to 82C function as racks 83A to 83C for supporting the wafers W. A horizontal wafer supporting level is defined by the racks 83A to 83C of the corresponding height. In other words, the wafer W is supported by these racks 83A to 83C by causing the lower surface at the periphery of the wafer W to abut against these racks 83A to 83C.

Incidentally, projections projecting inward from the side surfaces of the support rods 76A to 76C may be substituted for the grooves 82A to 82C for providing the racks 83A to 83C. It is also possible for the racks 83A to 83C, which are flat in the embodiment shown in the drawings, to be inclined inwardly downward.

Figure 6:
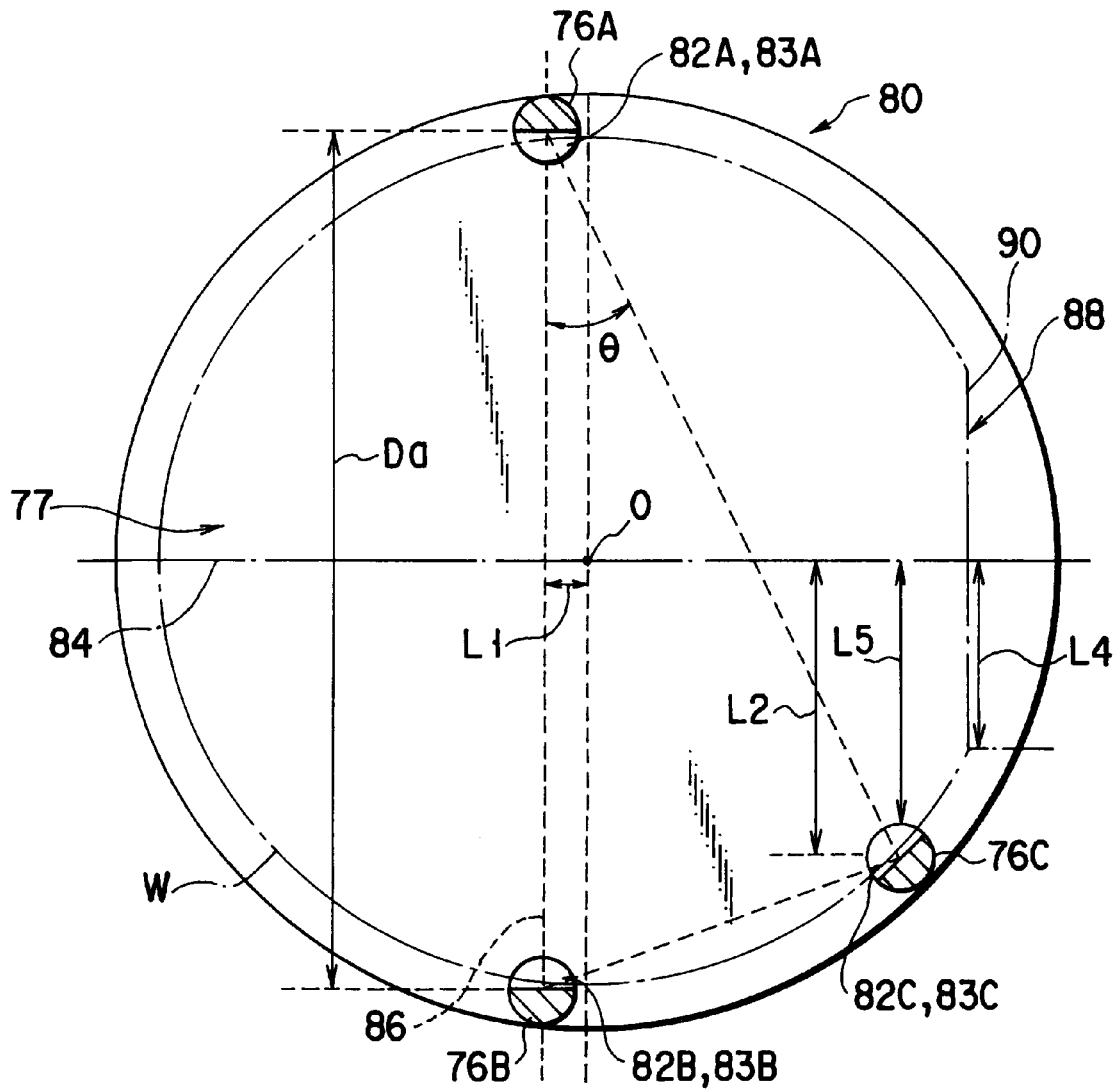
FIG. 6 is a cross sectional plan view showing the positional relationship between the wafer boat shown in FIG. 1 and a wafer.

As shown in FIG. 6, the support rods 76A and 76B positioned on the side of a port 77, through which the wafer W is transferred into and out of the wafer boat 34, are positioned closer to the port 77 by a slight distance L1 than the center O of the wafer W. In other words, the center of gravity of the wafer W resides on the side of the other support rod 76C relative to a line 86 joining the support rods 76A and 76B. The distance L1, which differs depending on the wafer size, should be about 20 mm in the case of a wafer sized at 8 inches. In view of the stability of the wafer, the distance L1 is desirably set to be larger, but an increase in the distance L1 while keeping the contour of the wafer boat 34 constant requires the grooves 82A and 82B to be deep, i.e., the support rods 76A and 76B to be thin. Where the contour of the wafer boat 34 is enlarged, the heater or heating means 21 have to be bigger. This is not preferable in light of suppressing the energy to be consumed. Accordingly, the distance L1 is desirable set to be larger so far as the mechanical strength of the support rods 76A and 76B is acceptable.

The support rods 76A and 76B should be arranged in symmetry with respect to an axis 84 parallel to the wafer transfer direction and passing through the center O of the wafer W or the center of the port 77. Likewise, the racks 83A and 83B should be arranged in symmetry with respect to the axis 84. The linear bottom portions of the grooves 82A and 82B of the support rods 76A and 76B are parallel to the axis 84 and a distance Da between these linear bottom portions is slightly larger than the diameter of the wafer W. As a result, the wafer W can be inserted into and taken out of these grooves 82A and 82B while preventing the wafer W from being brought into contact with the walls defining these grooves 82A and 82B.

As shown in FIG. 6, the wafer W includes a cutout 88 for the position alignment. In other words, a peripheral portion of the wafer W is linearly cut off to generate the cutout 88 and, thus, to form the orientation flat 90. The wafer W is put into or taken out of the wafer boat 34 under the state that the orientation flat 90 is positioned forward.

The support rod 76C that is positioned on the side of the orientation flat 90 relative to the center 0 of the wafer W is arranged apart from the axis 84 by a predetermined distance L2. In other words, the rack 83C of the support rod 76C is arranged flush with the other racks 83A and 83B defining a wafer supporting level and shifted by the distance L2 from the axis 84. The distance L2 is desirably set to fall within a range of 5% to 48%.

In other words, the three support rods 76A to 76C are arranged such that the gravity center of the wafer is positioned in a triangle formed by connecting the three racks 83A to 83C, e.g., a triangle formed by connecting the centers of three support rods 83A to 83C in this embodiment. In view of the stability of the wafer, the triangle should be larger, but its size is limited by various factors as described below. Where an angle θ is formed between the line connecting the racks 83A and 83B and the line connecting the racks 83A and 83C, the positional relationship of the three racks 83A to 83C is described by the angle θ as follows. Specifically, the lower limit of the angle θ is set to be desirably not less than 10°, and more desirably not less than 20°, in view of the stability of the wafer. On the other hand, the upper limit of the angle θ is set to be desirably not more than 450 in light of a wafer with a notch explained later, and more desirably not more than 35°, in light of a long transfer arm and a wafer with an orientation flat.

Figure 7:
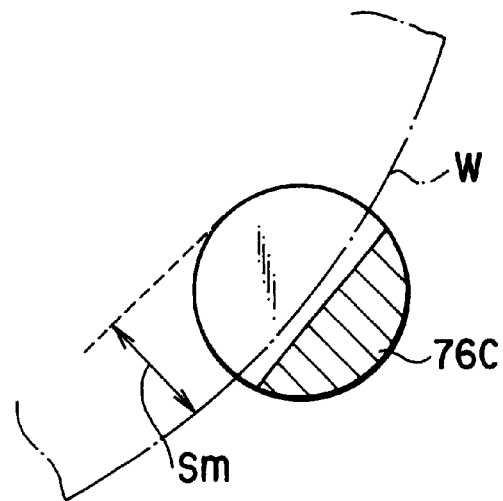
FIG. 7 is a cross sectional view showing in a magnified fashion a part of the support rod of the wafer boat shown in FIG. 1.

For example, where the transfer arm 66 is so long as to protrude on the opposite side of the wafer boat 34 as shown in FIG. 8, it is necessary to avoid the interference and collision between the support rod 76C and the transfer arm 66. Therefore, the support rod 76C and the support rack 83C should be apart from the axis 84 by a length larger than a length L3 that is half the width of the transfer arm 66. In this case, the distance L2, i.e., the shifting amount of the support rod 76C, is desirably slightly larger than the distance L3 and is substantially equal to the sum of the separation distance L5 between the axis 84 and the support rod 76C and the depth of the groove 82C.

Where the wafer W includes the orientation flat 90, the distance L2 should desirably be set larger than a length L4 that is half the width of the orientation flat 90, as shown in FIG. 6. In other words, the rack 83C of the support rod 76C should desirably be capable of supporting an arcuate peripheral portion of the wafer W. In this case, a wafer having a notch-like cutout (see FIG. 9) for the position alignment is inserted into the groove 82C in an overlapping amount Sm with the groove 82C equal to that shown in FIG. 7.

In view of stability of the wafer W, it is most desirable to arrange the support rod 76C and the rack 83C on the axis 84. In this case, however, an interference takes place between the long transfer arm 66 and the support rod 76C. Also, if the groove 82C is formed to be adapted for both a wafer having a notch and a wafer having an orientation flat, the groove 82C is rendered unduly deep. In this case, the overlapping amount of the wafer having a notch with the grooves 82A and 82B is rendered different from that with the groove 82C. This is not desirable in terms of uniformity in the thickness of a film to be formed on the wafer.

The length L4, which is half the width of the orientation flat 90, should be about 22 to 25 mm and about 22 to 30 mm in the cases of the 6-inch wafer and the 8-inch wafer, respectively. In other words, the length L4 depends on the wafer size and, thus, is not constant.

Figure 5:
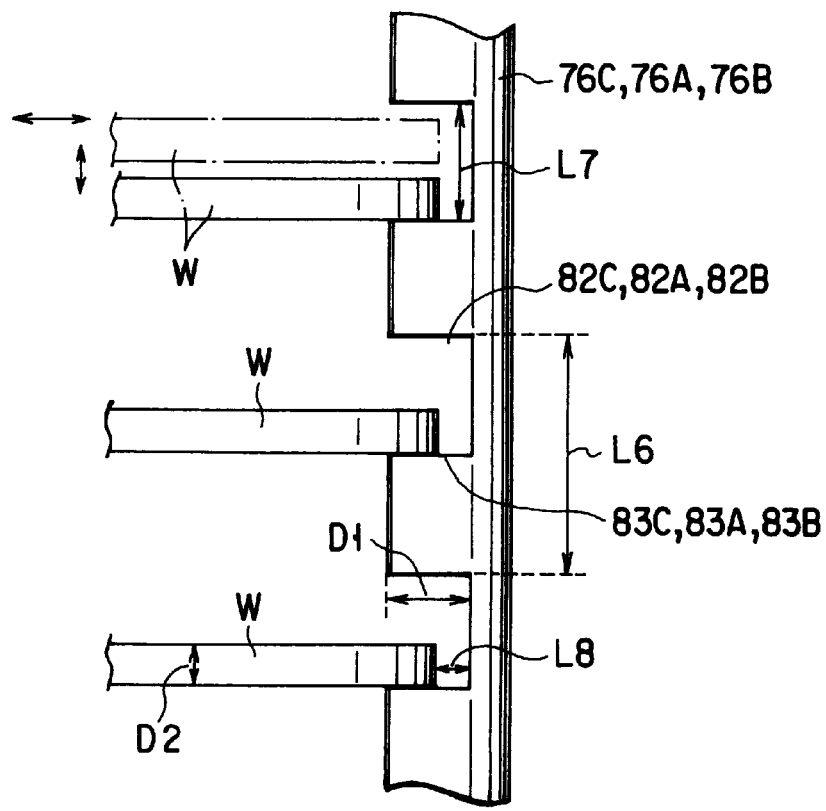
FIG. 5 shows in a magnified fashion a part of the wafer boat shown in FIG. 1.

All the grooves 82A to 82C and racks 83A to 83C of the support rods 76A to 76C are set substantially the same in the shape and size. As shown in, for example, FIG. 5, the pitch L6 of the grooves 82C (82A, 82B) is set at about 3/16 inches (4.76 mm) and about ¼ inches (6.35 mm) in the cases of the 6-inch wafer and the 8-inch wafer, respectively. Also, the height L7 is set at about 25 to 3 mm and about 35 to 4 mm in the cases of the 6-inch wafer and the 8-inch wafer, respectively. Further, the depth D1 and the clearance L8 are set at about 5 mm and about 1 to 15 mm, respectively, regardless of the wafer size. Incidentally, the thickness D2 of the wafer W is about 0.7 to 0.8 mm in each of the 6-inch wafer and the 8-inch wafer.

The operation of the vertical heat treating system shown in FIGS. 1 and 2 will now be described.

In the first step, the boat elevator 12 is driven to move the arm 48 to the lower stopping position or the transfer position, as shown in FIG. 2. Under this condition, untreated wafers W are successively transferred onto the wafer boat 34. In transferring the wafers W, each wafer W is held on the transfer arm 66 of the transfer device 54, and the transfer arm 66 is horizontally slid toward the wafer boat 34 so as to transfer the wafer W into the grooves on the side of the wafer boat 34. Since the wafer transfer is performed while intermittently moving the transfer base 58 upward or downward, a large number of wafers W are held by the wafer boat 34 at a predetermined vertical pitch.

Then, the boat elevator 12 is driven to move upward gradually the wafer boat 34 holding the wafers W to cause the wafer boat 34 to be loaded through the lower port of the manifold 32 into the process chamber 26 heated in advance to a predetermined temperature. After loading of the wafer boat 34 in the process chamber 26, the lower port of the manifold 32 is closed by the lid 40 so as to airtightly close the process chamber 26. Then, the wafers W are heated by the heating means 28 to a predetermined process temperature. Also, a process gas for the heat treatment, e.g., a film-forming gas, is supplied through the supply nozzle 70 into the process chamber and, at the same time, the process chamber 26 is evacuated through the exhaust nozzle 72 so as to maintain the predetermined process temperature within the process chamber 26. Under such conditions, a heat treatment, e.g., a film-forming treatment, is applied to the wafer W.

After completion of the heat treatment, the temperature within the process chamber 26 is lowered and the treated gas is withdrawn from the process chamber 26, followed by replacing the inside of the process chamber 26 with an inert gas such as a nitrogen gas. Then, the boat elevator 12 is driven to move downward the lid 40 so as to gradually unload the wafer boat 34 from within the process chamber 26. When the wafer boat 34 is unloaded completely from within the process chamber 26, the treated wafers are taken out one by one from the wafer boat 34, thereby to finish a series of the heat treating operations.

The wafer transfer between the wafer boat 34 and the transfer arm 66 and the state of the wafers W held by the wafer boat 34 will now be described in detail.

As shown in FIG. 3, a part of the wafer W in the direction of the diameter is rested in the recess 68 formed in the upper surface of the transfer arm 66. Where the transfer arm 66 is moved forward or backward or stopped, the stepped portion of the recess 68 acts as a stopper so as to prevent the wafer W from being dropped from the transfer arm 66. Because of the particular function of the transfer arm 66, the tip portion of the transfer arm 66 projects forward of the orientation flat 90 of the wafer W.

Accordingly, the support rod 76C positioned behind the support rods 76A and 76B in the wafer loading direction is arranged in a position laterally deviant from the axis 84 in order to avoid the interference with and collision against the transfer arm 66, as shown in FIG. 8. As a result, the wafer W can be supported by three points, i.e., by the racks 83A to 83C of the three support rods 76A to 76C, while avoiding the interference with the transfer arm 66. Therefore, even if the wafer boat 34 is vibrated when the boat 34 is moved in a vertical direction, it is possible to prevent the collision of a low frequency between the wafer W and the wafer supporting grooves like chattering that takes place in the conventional wafer boat 1. Naturally, the particle generation caused by the collision can be prevented so as to improve the product yield.

It is unavoidable for the wafer boat 34 itself to be slightly deformed by the repetition of the heat treatment. In this case, the peripheral portion of the wafer W and the grooves 82A to 82C are considered to be brought into mutual contact so as to bring about the particle generation when the wafer W is put into and taken out of the wafer boat 34, though the particle generation may not be serious. In the present invention, however, the support rod 76C alone is arranged behind the center in the wafer loading direction, though two support rods are arranged behind the center in the conventional wafer boat 1. This is significant because the support rods arranged behind the center tend to be thermally deformed more greatly. To be more specific, the particle generation can be suppressed in the present invention because only one support rod 76C alone is arranged behind the center.

[Experiment]

A conventional wafer boat including four support rods and a wafer boat of the present invention including only three support rods were moved up and down by the boat elevator 12 so as to measure the noise generated by the vibration of the wafer boat. Table 1 shows the result.

TABLE 1

| | | Conventional Boat | | Invented Boat | |
|---|---|---|---|---|---|
| Direction | | Up | Down | Up | Down |
| Speed (mm/min) | 20 | No | No | No | No |
| | 70 | No | Slight | No | No |
| | 100 | Slight | Slight | No | No |
| | 466.67 | Small | Small | No | Slight |
| | 691.67 | Large | Large | Small | Small |
| | 991.67 | Small | Small | Slight | Slight |

The notation "No" in Table 1 denote that vibrating noise was not recognized. As apparent from Table 1, the experiment was conducted by changing the elevator speed in various fashions. It is clearly seen that the vibrating noise generated by the wafer boat of the present invention was smaller than that generated by the conventional wafer boat over the entire range of the elevator speed. In the case of the wafer boat of the present invention in which the wafers are supported by three points, a small clearance between the peripheral portion of the wafer W and the fourth support rod is eliminated so as to diminish the noise of collision. A decrease in the particle generation can be indirectly supported by the decrease in the noise of collision. Table 1 also shows that each of the wafer boat of the present invention and the conventional wafer boat produces the largest vibrating noise when the elevator is moved at a speed of 691.67 mm/min. It is considered reasonable to understand that resonance takes place among the wafer boat, the elevator, etc. when the wafer boat is moved at a speed in the vicinity of the speed noted above so as to generate the largest vibrating noise.

Figure 13A:
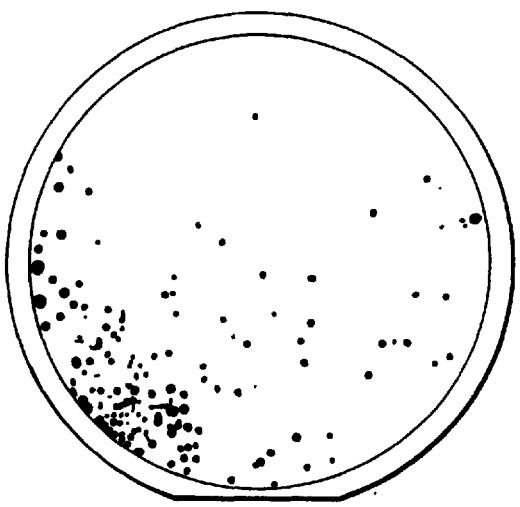
FIGS. 13A and 13B show distributions of the generated particles for a conventional wafer boat and for a wafer boat of the present invention, respectively.
Figure 13B:
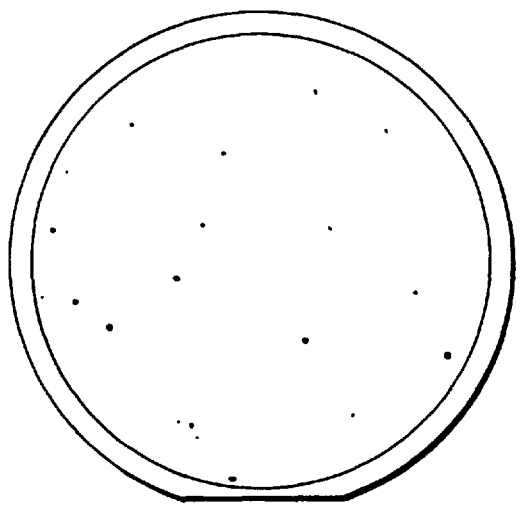

The particle distribution on the wafer surface was also examined, with the results as shown in FIGS. 13A and 13B. FIG. 13A shows the particle distribution on the wafer surface in the case of using the conventional wafer boat. On the other hand, FIG. 13B shows the particle distribution on the wafer surface in the case of using the wafer boat of the present invention. As apparent from the comparison between FIGS. 13A and 13B, the wafer boat of the present invention makes it possible to suppress markedly the particle generation. The number of particles distributed on the wafer surface was counted by a laser scattering type particle counter, with the result that the number of particles was markedly decreased, i.e., decreased by 54%, in the case of the wafer boat of the present invention.

It was also observed that, in the case of the conventional wafer boat, the particles tended to be concentrated in the vicinity of each of the support rods. In the wafer boat of the present invention, however, the particle concentration in the wafer supporting groove was eliminated to obtain a dust map in which the particles were distributed at random.

Figure 9:
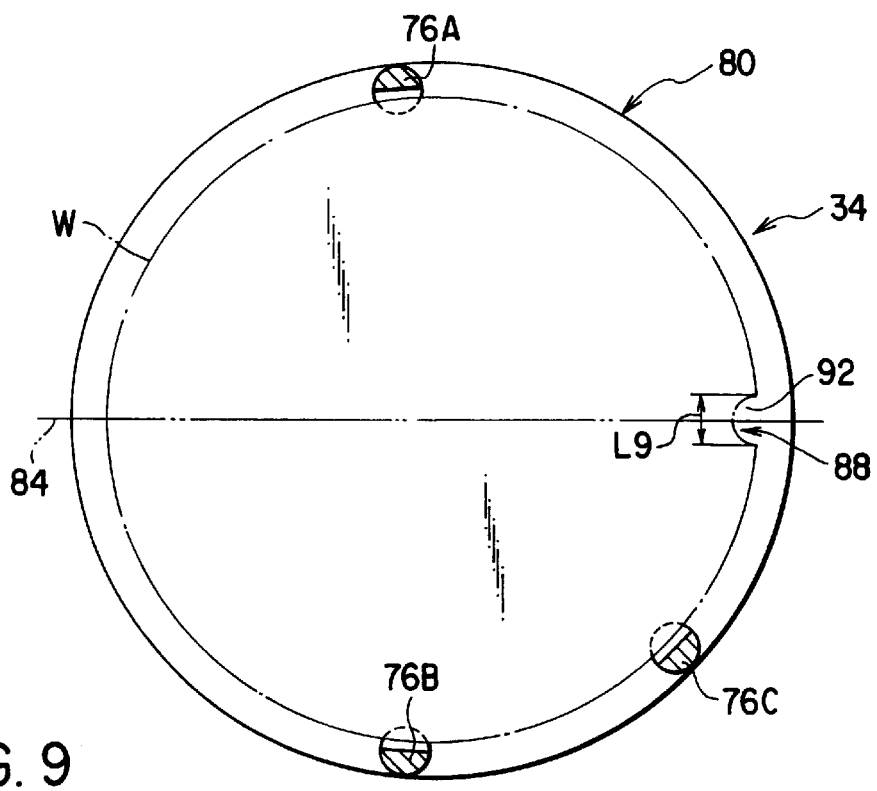
FIG. 9 is a cross sectional plan view showing the positional relationship between the wafer boat shown in FIG. 1 and a wafer having a notch.

FIG. 9 is a cross sectional plan view showing the positional relationship between the wafer boat 34 and a wafer W having a notch 92. In the wafer W shown in FIG. 9, a cutout 88 for the position alignment consists of a substantially semi-circular notch 92 having a diameter L9 of several millimeters. If the support rod 76C is positioned away from the axis 84 by a distance larger than half the length L4 of the orientation flat 90 as shown in FIG. 6, the wafer having the notch 92 can also be supported satisfactorily as shown in FIG. 9.

In the case where the distance between the support rod 76C and the axis 84 is shorter than the length L4, which is half the width of the orientation flat 90, and where the groove 82C is equal in size to the grooves 82A and 82B of the other support rods 76A and 76B, it is possible to support the wafer W having the notch 92, but it is impossible to support the wafer W having the orientation flat 90. On the other hand, even if the distance between the support rod 76C and the axis 84 is shorter than the length L4, such a modification of the groove 82C of the support rod 76C that increases the depth of the groove 82C makes it possible to support either of the wafer W having the notch 92 and the wafer W having the orientation flat 90. In this case, however, the overlapping amount of the wafer having the notch with the grooves 82A and 82B differs from that with the groove 82C, so a film to be formed on the wafer surface may be undesirably less uniform. It should also be noted that, the three support rods having different diameters may cause the thickness of the film to be less uniform.

Under the circumstances, it is desirable to arrange the support rod 76C in a region deviant from the region of the orientation flat 90. However, if the length L2 shown in FIG. 6 is excessively larger than the length L4 (for example, if the center of the wafer is positioned outside the triangle formed by connecting the three racks 83A to 83C), the wafer fails to be supported stably by three points. Naturally, the position of the support rod 76C should be determined appropriately not to impair the stability of the wafer supported by the three support rods 76A to 76C.

Figure 10:
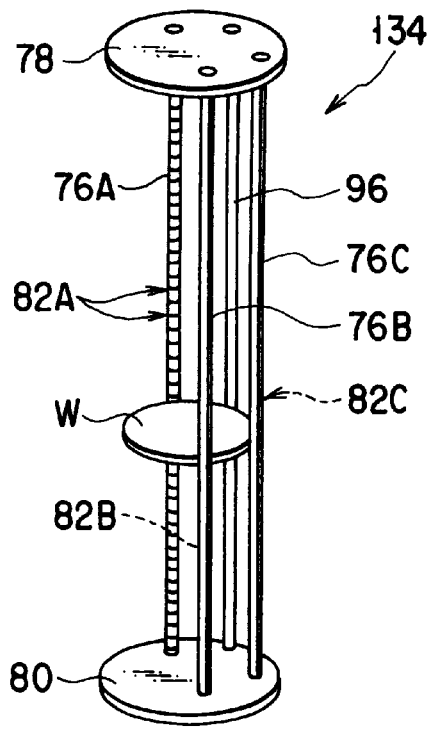
FIG. 10 is a perspective view showing a boat for semiconductor wafers according to another embodiment of the present invention.
Figure 11:
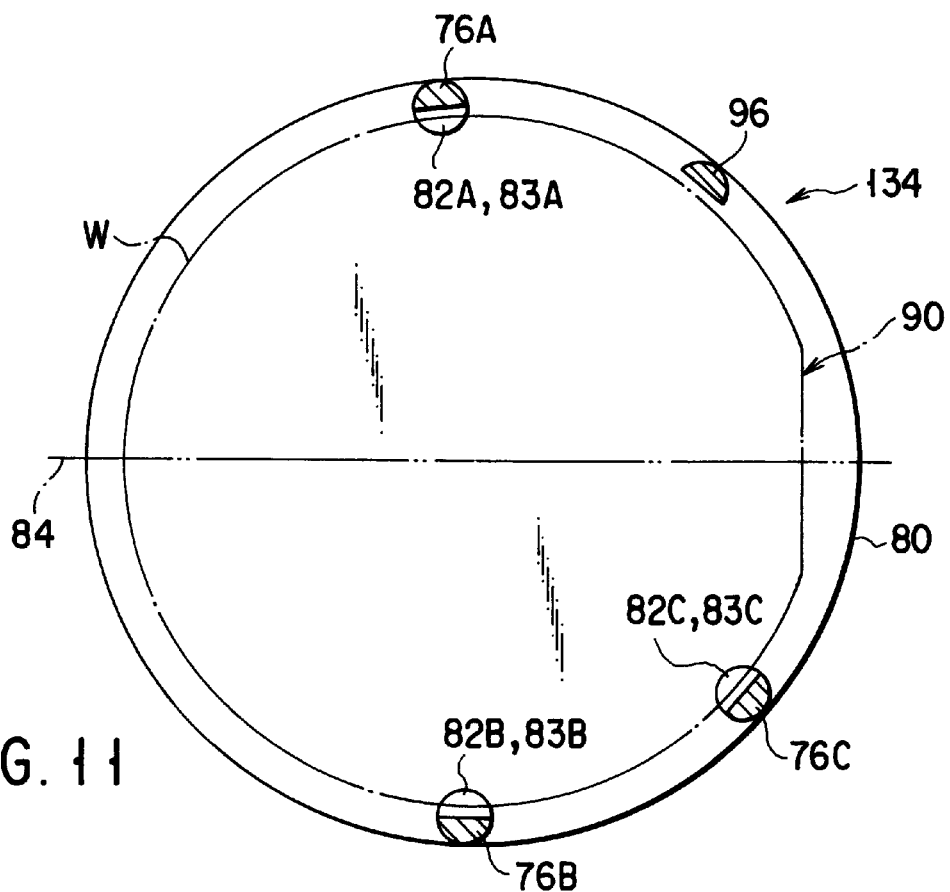
FIG. 11 is a cross sectional plan view showing the positional relationship between the wafer boat shown in FIG. 10 and a wafer.

FIG. 10 is a perspective view showing a wafer boat 134 according to another embodiment of the present invention, and FIG. 11 is a cross sectional plan view showing the positional relationship between the wafer boat 134 and a wafer W having the orientation flat 90. In the wafer boat 34 of the first embodiment shown in FIGS. 1 to 9, the three support rods 76A to 76C are fixed to the top plate 78 at the upper ends and to the bottom plate 80 at the lower ends. However, it is possible to use an additional reinforcing support rod, that is not provided with grooves and, thus, is irrelevant to the function of supporting the wafer W, in order to suppress the thermal deformation and to improve the mechanical strength of the wafer boat.

As shown in FIG. 10, the wafer boat 134 comprises a reinforcing support rod 96 having an arcuate or a semi-circular cross section. The reinforcing support rod 96 is arranged in symmetry with the support rod 76C with respect to the axis 84. It should be noted that the reinforcing support rod 96 is not provided with a rack serving to define the wafer supporting level. In this embodiment, the mechanical strength of the wafer boat can be increased while suppressing the particle generation at a low level.

Figure 12:
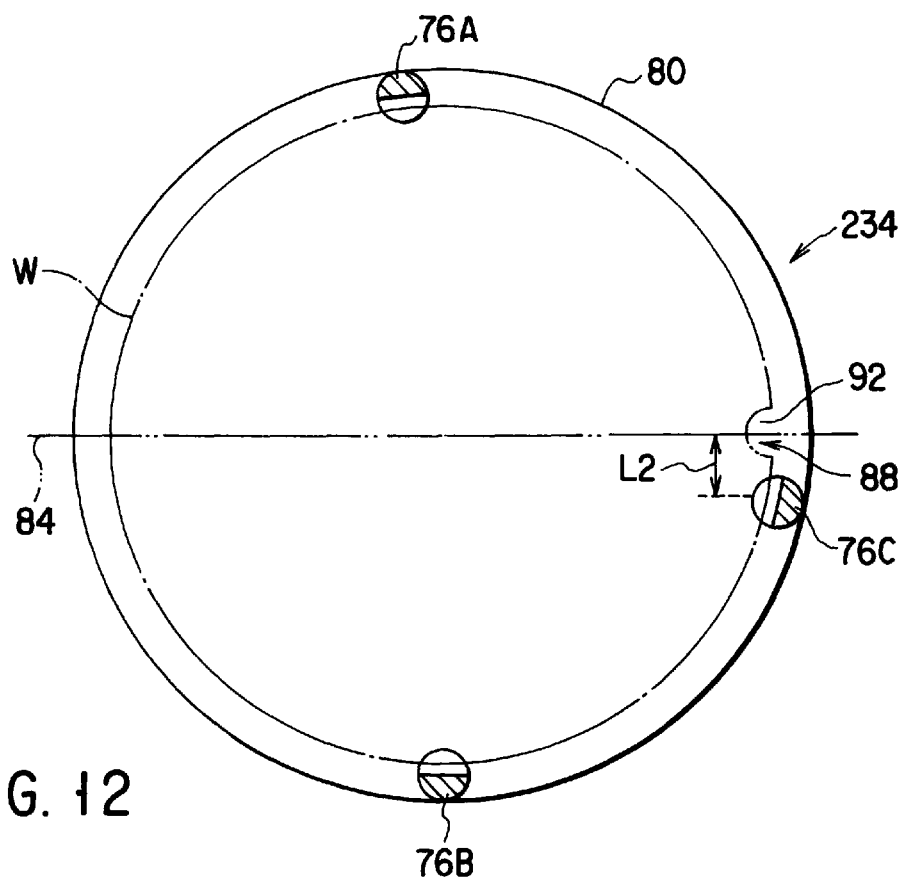
FIG. 12 is a cross sectional plan view showing the positional relationship between a boat for semiconductor wafers according to still another embodiment of the present invention and a wafer.

FIG. 12 is a cross sectional plan view showing the positional relationship between a wafer boat 234 according to still another embodiment of the present invention and a wafer W having the notch 92.

In the wafer boats 34 and 134 shown in FIGS. 1 to 11, the support rod 76C is arranged apart from the axis 84 by a distance greater than half the width of the transfer arm 66 in order to prevent the support rod 76C from interfering with the long transfer arm 66 and, thus, to ensure the support of the wafer W. However, where, for example, the reciprocating movement of the transfer arm 66 is carried out at a relatively low speed, it is possible to use a short transfer arm. In this case, the interference between the support rod 76C and the transfer arm need not be considered.

Where only the wafers each having the notch 92 as a cutout for the position alignment are handled under the situation that the interference between the support rod 76C and the transfer arm need not be considered, the support rod 76C can be arranged close to the notch 92, as shown in FIG. 12. In other words, the length L2 between the axis 84 and the support rod 76C can be made markedly smaller than that shown in FIG. 6. In this case, the wafers are supported at three points substantially equidistantly apart from each other in substantially the semicircular portion of the wafer so as to increase the stability of the supported wafer. Needless to say, the particular function and effect described previously can also be obtained in this embodiment, too.

In each of the embodiments described above, the technical idea of the present invention is applied to a film-forming apparatus. However, the technical idea of the present invention can also be applied to other heat treating systems such as the oxidation/diffusion apparatus and an annealing apparatus. Also, the technical idea of the present invention is applied to the 6-inch wafers and 8-inch wafers in each of the embodiments described above. However, wafers of other sizes, e.g., 12-inch wafers, can also be handled in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A boat for holding a plurality of semiconductor wafers to be vertically stacked with gaps therebetween, said wafers having circular contours of substantially the same size, comprising:

upper and lower frames arranged at upper and lower end portions, respectively, of said boat; and first, second and third support rods arranged between and connected to said upper and lower frames, said first, second and third support rods being arranged such that a port through which the wafers are transferred into and taken out of said boat is defined between said first and second support rods, wherein said first, second and third support rods are provided with a plurality of first racks vertically arrayed with gaps therebetween, a plurality of second racks vertically arrayed with gaps therebetween, and a plurality of third racks vertically arrayed with gaps therebetween, respectively, such that a plurality of horizontal wafer supporting levels are defined between said upper and lower frames by said racks, each wafer supporting level being defined by combination of first, second and third racks having corresponding height, and wherein said first and second racks are arranged substantially in symmetry with respect to an axis which is parallel to a transfer direction, in which the wafers are transferred into and out of said boat through said port, and passes through a center of said port, and said third rack is shifted from said axis by a certain distance.

2. The boat according to claim 1, wherein said certain distance is 5% to 48% of a diameter of each wafer.

3. The boat according to claim 2, wherein an angle formed between a line connecting said first and second racks and a line connecting said first and third racks is set to be from 20° to 35°.

4. The boat according to claim 2, wherein each wafer includes an orientation flat prepared by cutting flat an edge portion of the wafer, and said certain distance is larger than half a width of said orientation flat.

5. The boat according to claim 4, wherein said first, second and third racks are defined by grooves formed in said first, second and third support rods, said boat further comprises a reinforcing support rod arranged between and connected to said upper and lower frames, said reinforcing support rod is provided with no racks serving to define said wafer supporting levels, and said third support rod and said reinforcing support rod are arranged substantially in symmetry with respect to said axis.

6. The boat according to claim 1, wherein each of said first, second and third racks has a substantially horizontal plane.

7. The boat according to claim 1, wherein said first, second and third racks are defined by grooves formed in said first, second and third support rods, respectively.

8. The boat according to claim 1, further comprising a reinforcing support rod arranged between and connected to said upper and lower frames, said reinforcing support rod being provided with no racks serving to define said wafer supporting levels.

9. The boat according to claim 8, wherein said third support rod and said reinforcing support rod are arranged substantially in symmetry with respect to said axis.

10. The boat according to claim 1, wherein each of said upper and lower frames, and each of said first, second and third support rods is formed of a material selected from the group consisting of quartz, SiC, ceramic material, polycrystalline silicon, and carbon.

11. A vertical heat treating system, comprising:

(a) a heating furnace for applying a heat treatment simultaneously to a plurality of semiconductor wafers having circular contours of substantially the same size;

(b) a boat for holding the wafers to be vertically stacked with gaps therebetween within said heating furnace;

(c) a boat transfer device for transferring said boat holding the wafers between a position within said heating furnace and a transfer position outside said heating furnace; and (d) a transfer device including a transfer arm capable of a reciprocating movement for transfer of each wafer into and out of said boat at said transfer position, said boat including upper and lower frames arranged at upper and lower end portions, respectively, of said boat, and first, second and third support rods arranged between and connected to said upper and lower frames, said first, second and third support rods being arranged such that a port through which the wafers are transferred into and taken out of said boat is defined between said first and second support rods, wherein said first, second and third support rods are provided with a plurality of first racks vertically arrayed with gaps therebetween, a plurality of second racks vertically arrayed with gaps therebetween, and a plurality of third racks vertically arrayed with gaps therebetween, respectively, such that a plurality of horizontal wafer supporting levels are defined between said upper and lower frames by said racks, each wafer supporting level being defined by combination of first, second and third racks having corresponding height, and wherein said first and second racks are arranged substantially in symmetry with respect to an axis which is parallel to a transfer direction, in which the wafers are transferred into and out of said boat through said port, and passes through a center of said port, and said third rack is shifted from said axis by a certain distance.

12. The system according to claim 11, wherein said certain distance is 5% to 48% of a diameter of said wafer.

13. The system according to claim 12, wherein each wafer includes an orientation flat prepared by cutting flat an edge portion of the wafer, and said certain distance is set larger than half a width of said orientation flat.

14. The system according to claim 13, wherein said third rack is apart from said axis by a distance larger than half a width of said transfer arm in a direction perpendicular to said transfer direction.

15. The system according to claim 14, wherein said first, second and third racks are defined by grooves formed in said first, second and third support rods, said boat further comprises a reinforcing support rod arranged between and connected to said upper and lower frames, said reinforcing support rod is provided with no racks serving to define said wafer supporting levels, and said third support rod and said reinforcing support rod are arranged substantially in symmetry with respect to said axis.

16. The system according to claim 11, each of said first, second and third racks has a substantially horizontal plane.

17. The system according to claim 11, wherein said first, second and third racks are defined by grooves formed in said first, second and third support rods, respectively.

18. The system according to claim 11, further comprising a reinforcing support rod arranged between and connected said upper and lower frames, said reinforcing support rod being provided with no racks serving to define said wafer supporting levels.

19. The system according to claim 18, wherein said third support rod and said reinforcing support rod are arranged substantially in symmetry with respect to said axis.

20. The system according to claim 11, wherein each of said upper and lower frames, and each of said first, second and third support rods is formed of a material selected from the group consisting of quartz, SiC, ceramic material, polycrystalline silicon, and carbon.

* * * * *